United States Patent

Laing et al.

[11] Patent Number: 5,665,174
[45] Date of Patent: Sep. 9, 1997

[54] PLATFORM FOR RECOVERING SOLAR ENERGY

[76] Inventors: Johannes Nikolaus Laing, 7148 Remseck-2, Hofenerweg 37, Germany; Inge Laing, 1253 La Jolla Rancho Rd., La Jolla, Calif. 92037

[21] Appl. No.: 356,392
[22] PCT Filed: Feb. 16, 1993
[86] PCT No.: PCT/EP93/00368
   § 371 Date: Jan. 9, 1995
   § 102(e) Date: Jan. 9, 1995
[87] PCT Pub. No.: WO93/25856
   PCT Pub. Date: Dec. 23, 1993

Related U.S. Application Data

[63] Continuation-in-part of Ser. No. 898,160, Jun. 15, 1992, Pat. No. 5,286,305.

[51] Int. Cl.⁶ .......... H01L 31/052; H01L 31/058
[52] U.S. Cl. .......... 136/246; 126/565; 126/567; 136/248
[58] Field of Search .......... 136/246, 248; 126/565–568

[56] References Cited

U.S. PATENT DOCUMENTS 5,286,305  2/1994  Laing et al. .......... 136/246
5,445,177  8/1995  Laing et al. .......... 136/246

*Primary Examiner*—Aaron Weisstuch

[57] ABSTRACT

In a device designed as a rotatably mounted platform (a) for recovering solar electricity, the focusing roof layer (3) further deflects the incident radiation so that the light beams (122, 123, 126) formed by the concentrating optical system are incident approximately perpendicularly on the radiation converter (112) arranged underneath.

22 Claims, 5 Drawing Sheets

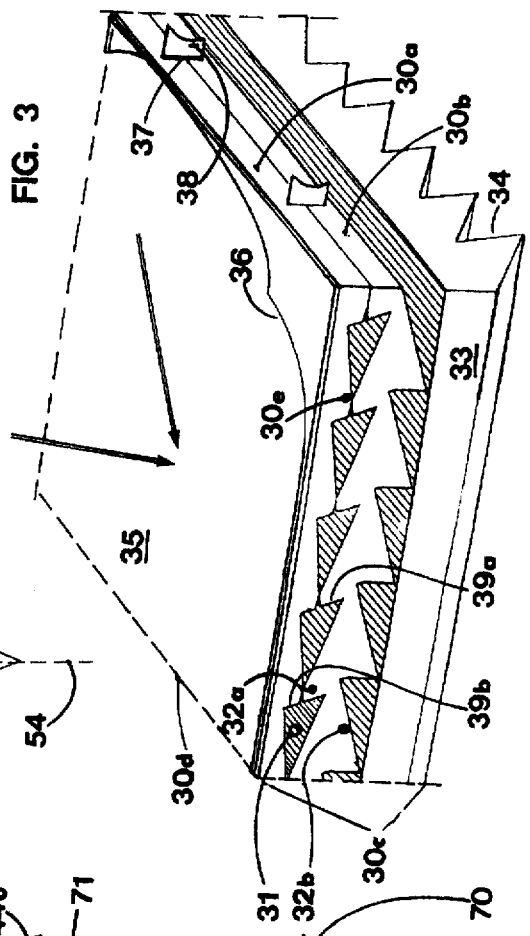
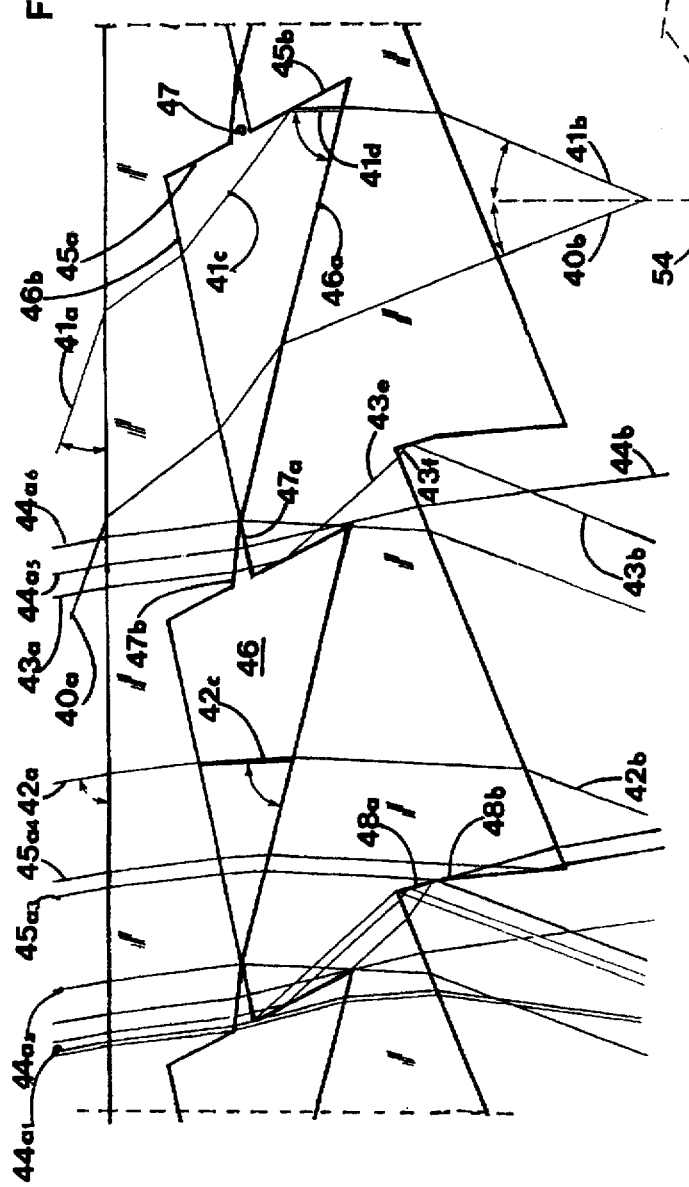
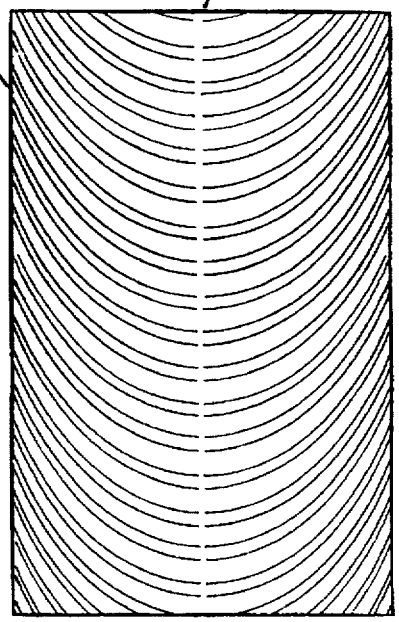

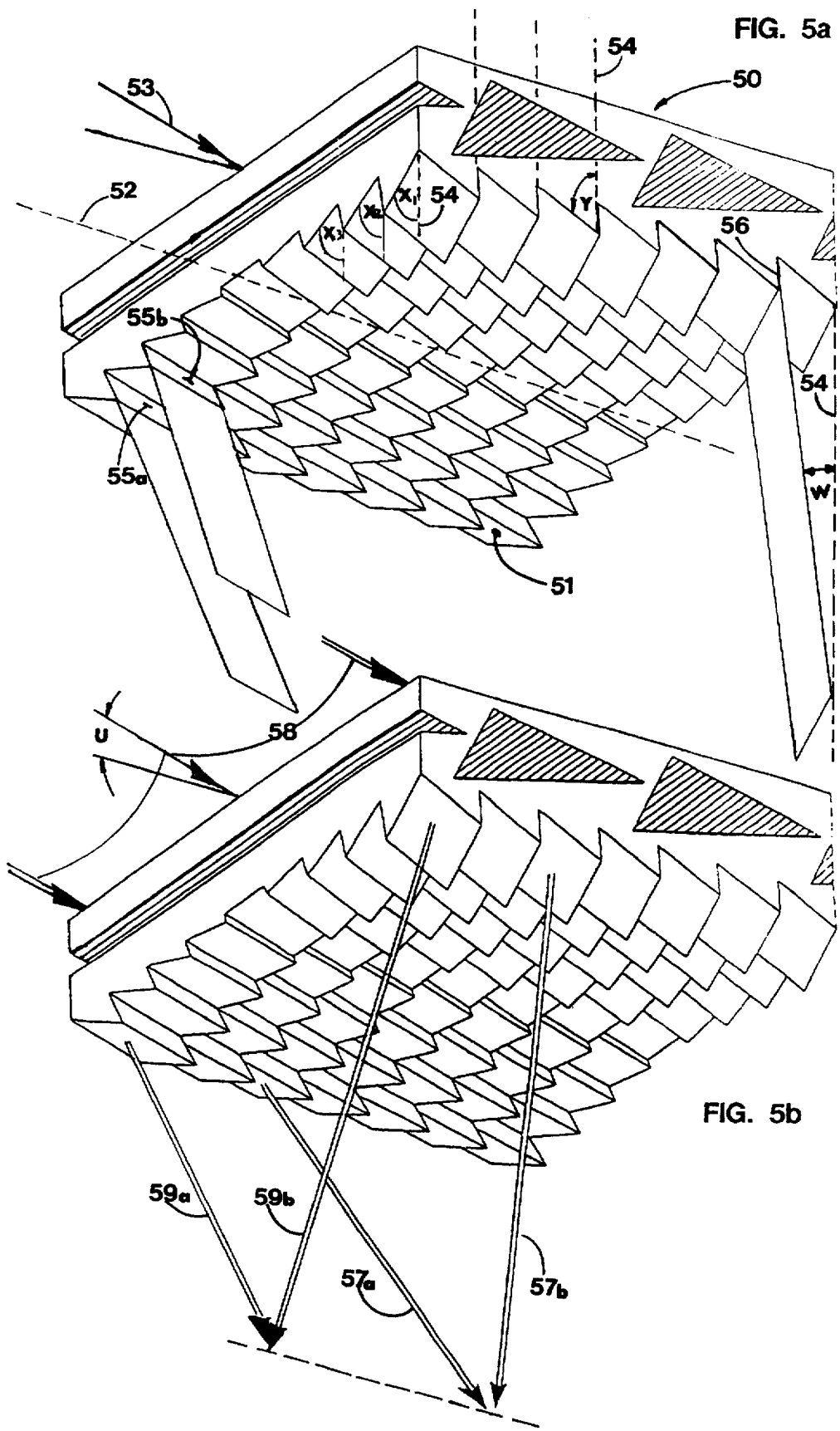

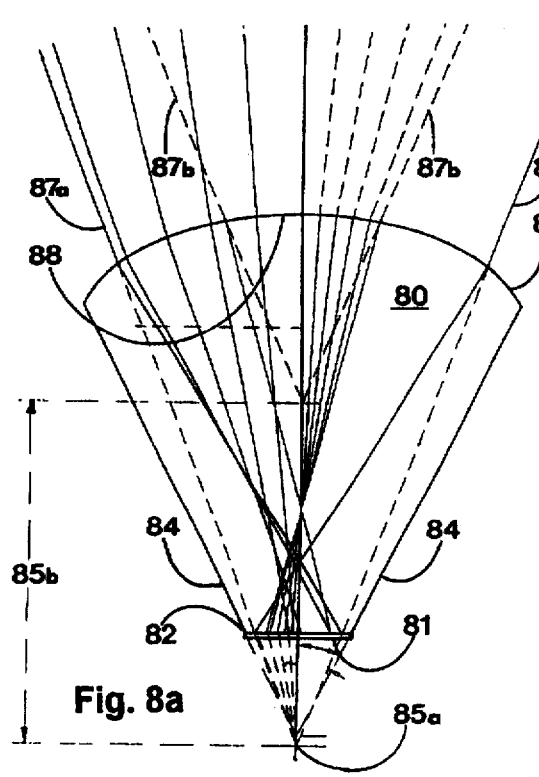
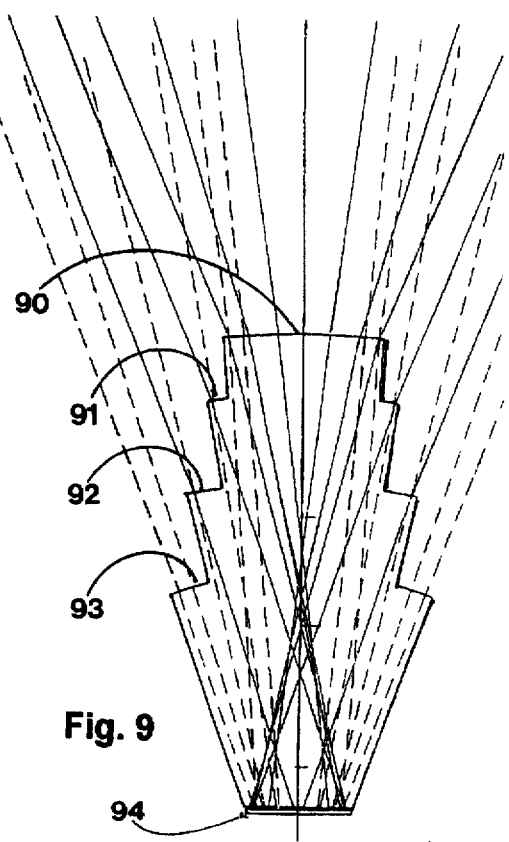
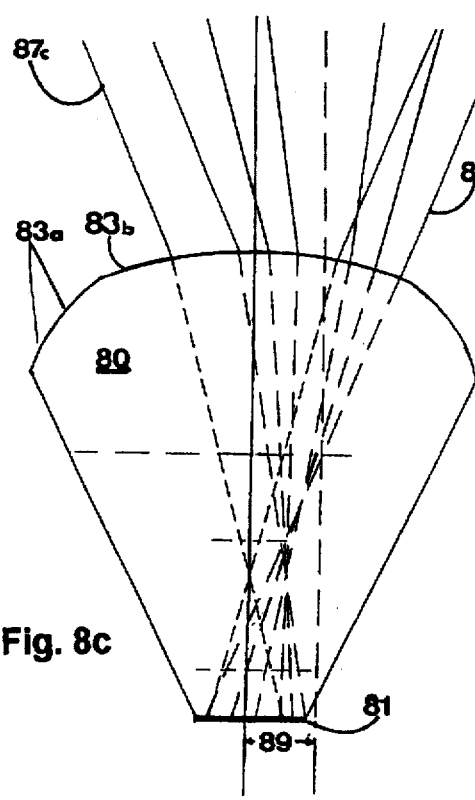
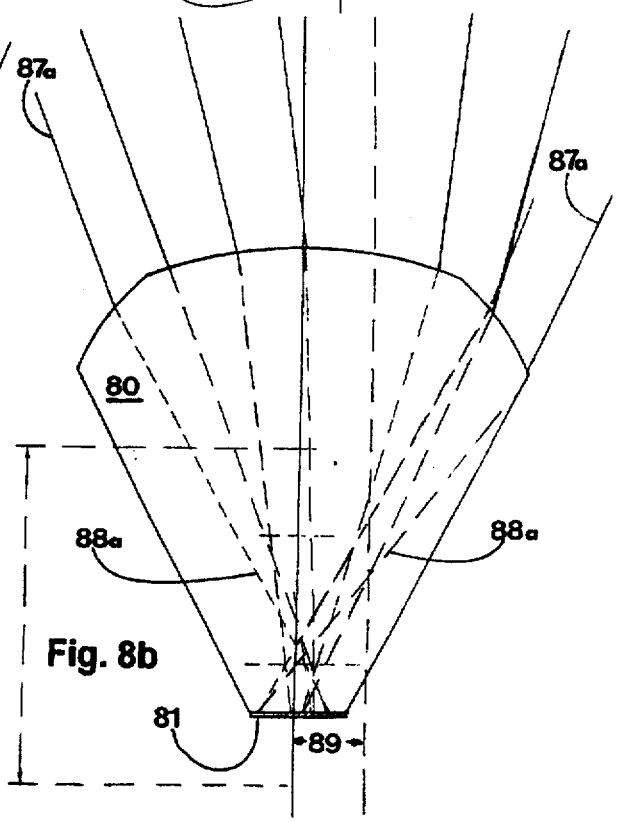

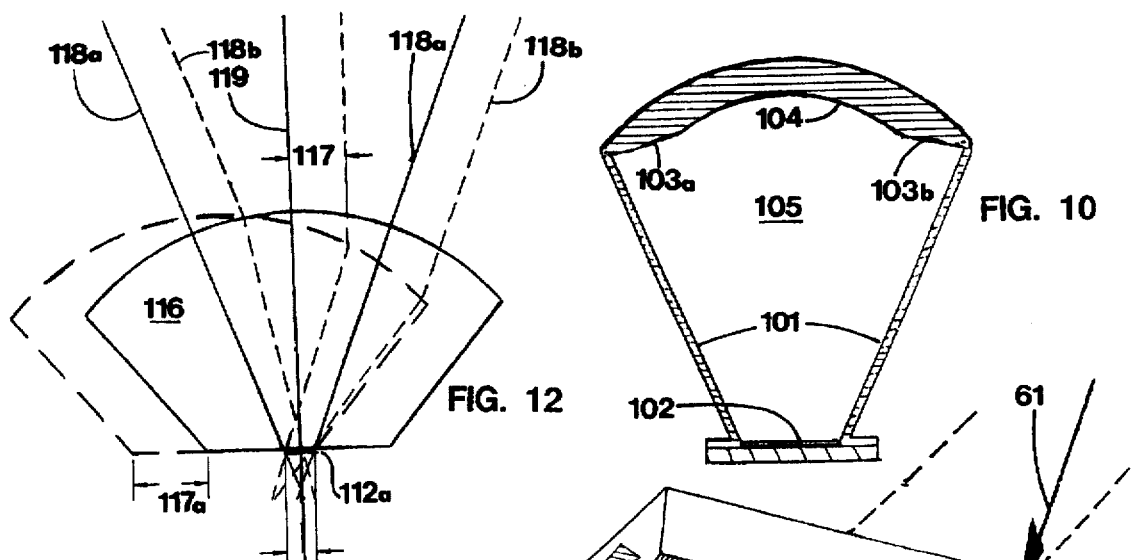
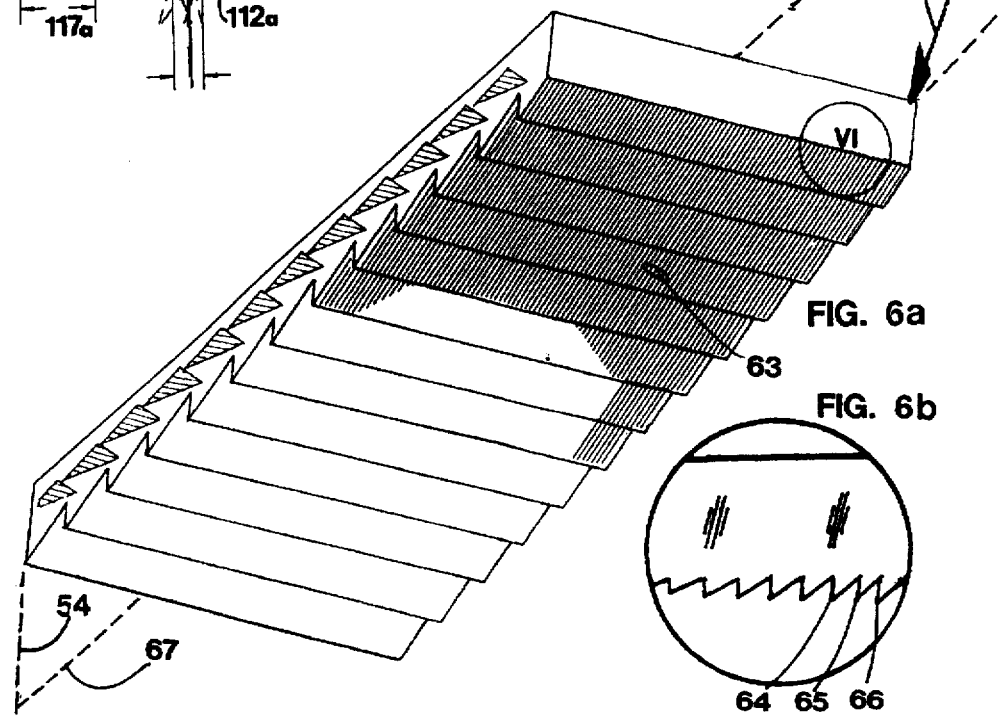
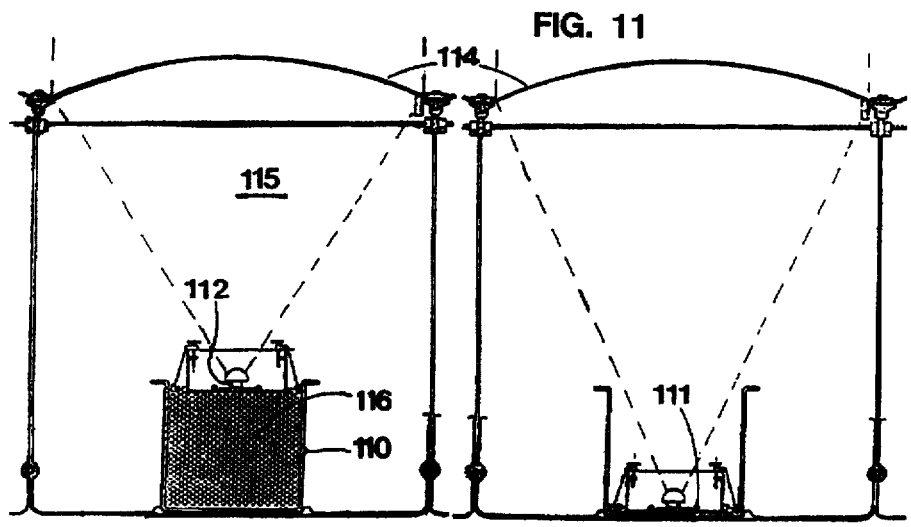

PLATFORM FOR RECOVERING SOLAR ENERGY

This application is a Continuation-In-Part of U.S. patent application Ser. No. 07/898,160 filed Jun. 15, 1992, U.S. Pat. No. 5,286,305.

FIELD OF THE INVENTION

The invention describes a platform which is supported by a water layer, experiences a daily rotation about the vertical axis at the angular velocity of the sun and is rotated back during the night. To follow the solar altitude, the incident radiation is refracted towards the vertical to such an extent that all refracted sunrays strike the radiation converter.

PRIOR ART

Solar energy converters which are arranged on a body of water and track the azimuth are known. Their disadvantage is that the concentrators have to be oriented according to the particular solar altitude, which entails considerable mechanical effort. A second disadvantage is that the pivotable concentrators give rise to high drags so that wind forces cause the total installation to vibrate. In addition, all large components exposed to wind forces must be constructed using an appropriate quantity of material. A third disadvantage is that concentrators placed one behind the other viewed in the direction of the sun must be installed such a large distance apart that they do not cast shadows on one another.

SUMMARY OF THE INVENTION

The object of the invention is the realization of two axis tracking in the case of a platform whose surface presents no end surfaces to the wind and in which furthermore the entire area of the platform is used as an aperture area owing to the absence of mutual shading.

In order to realize this, the invention envisages a platform having a metallic base which has parallel channels whose lower surfaces extend close to the base of a water tank and which carry the photocells, so that the heat loss is passed through the base into the water and in particular into the water volume located at a higher level. The sun's rays are guided over as large a solar elevation interval as possible by a cylindrical lens system which preferably consists of several lens arrangements located one underneath the other. The invention gives preference to a system in which triangular prismatic channels whose non-transmitting boundary faces are mirrored are formed between the lens arrangements. These lens arrangements substituting mechanical tracking of the solar elevation and referred to below as tracking lenses are arranged above a concentrating Fresnel lens. An advantageous embodiment envisages the integration of a tracking lens with a Fresnel lens. The invention furthermore relates to means which ensure that the photocells are irradiated as uniformly as possible. As a first measure, the photocells float in troughs and follow the height movement of a focal line. In a more advantageous solution, secondary lenses are used for compensation of the shift in height. It proves to be advantageous if the radiation is guided in such a way that the outward-facing layer of the horizontally oriented lens arrangement has an upward-facing first, smooth boundary face and possesses, on the downward-facing side, a group of secondary boundary faces divided into steps, the boundary faces of the steps making an angle with the first boundary face such that, optionally in cooperation with further lens arrangements, a sunray which makes an angle of more than 60° with the vertical is refracted to give an emerging ray which makes an angle of more than 110° with the direction of incidence of the sunray and at the same time and, simultaneously with the vertical, makes an angle of less than 30° with a limb opposite the direction of incidence, while a sunray whose angle of incidence relative to the vertical is less than 20° is refracted to give an emerging ray which points towards the sun and whose limb points towards the sun and which makes an angle of less than 30° with the vertical, so that the emerging rays are concentrated onto a radiation converter. In the most advantageous solution, the angles of incidence have equal magnitudes.

BRIEF DESCRIPTION OF THE DRAWINGS

FIG. 3 shows a perspective view of a lens arrangement.

FIG. 4 shows the beam path in a refined version.

FIGS. 5a and 5b show a flat lens system with facets.

FIG. 6 shows a flat lens with primary and secondary steps.

FIG. 7 schematically shows the paths of curved steps.

FIG. 8a shows the beam path in a secondary lens cut vertically and at right angles to the direction of the sun.

FIG. 8b shows the beam path in the same secondary lens with lateral shifting of a light beam at right angles.

FIG. 8c shows the beam path in the same secondary lens with lateral shifting of an oblique light beam.

FIG. 9 shows an embodiment whose cross-section is composed of trapezoids lying one on top of the other.

FIG. 10 shows a secondary lens which consists of a lens which converges in the outer regions and diverges in the inner region and is supported by mirrored walls.

FIG. 11 schematically shows a cross-section through channels in which photocells float.

FIG. 12 shows a secondary lens for compensation of lateral shifting of the light beam by displacement of a component.

DETAILED DESCRIPTION

Figure 1:
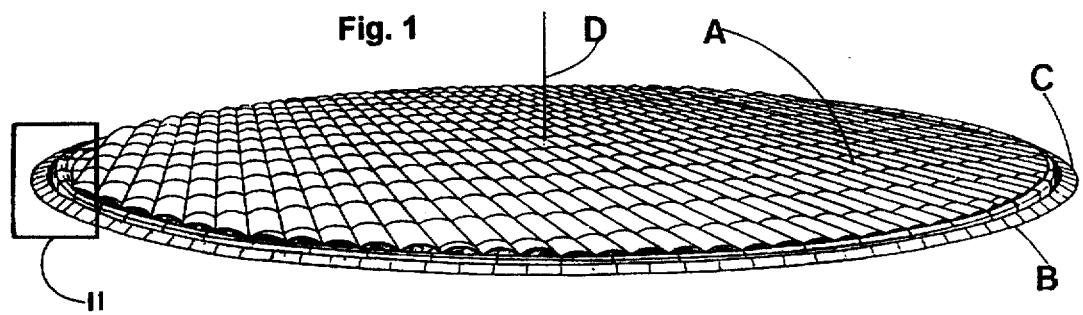
FIG. 1 schematically shows a platform having an edge zone.

FIG. 1 schematically shows the solar power station according to the invention, having a platform a, rotatable about the vertical axis d, and a frame b which floats in a channel c.

Figure 2:
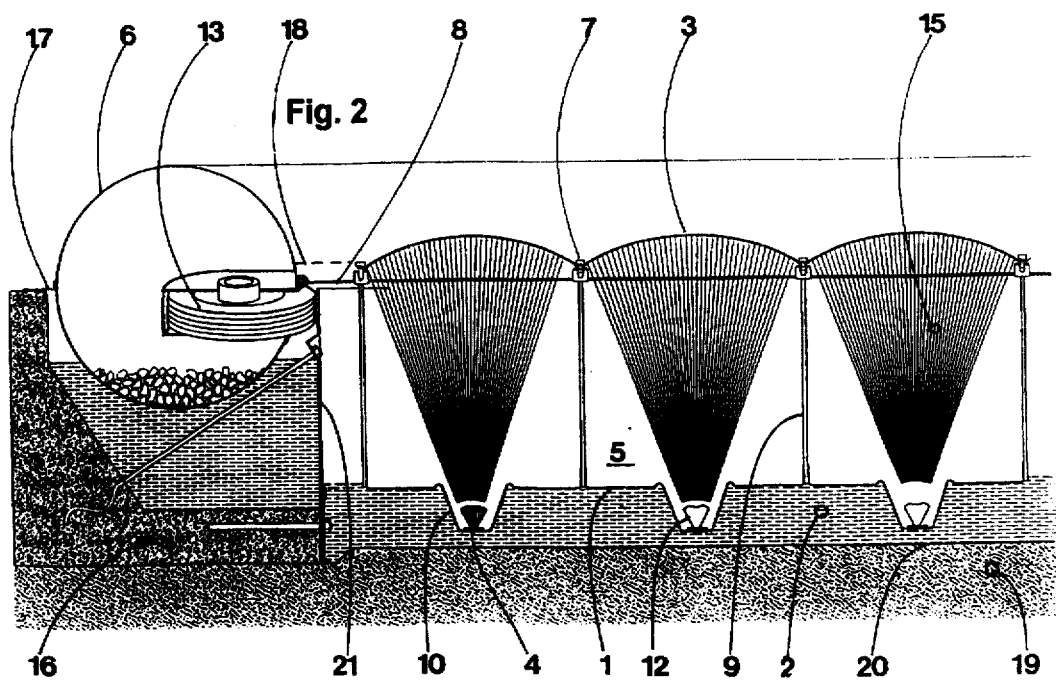
FIG. 2 shows a cut-out II from FIG. 1, in vertical section.

FIG. 2 shows a horizontal section of the cut-out II in FIG. 1. The energy conversion is effected on a circular platform a which is supported by a thin water layer 2 It is divided into, parallel concentrator tunnels 5. A toroidal pipe 6 surrounding the platform forms a frame for a network which keeps the concentrator tunnels an exact distance apart and which transmits the rotary movement imposed on the toroidal pipe 6 to the platform. The network is formed from sheet metal sections 7 and steel cables 8 and is kept a constant distance from metal base sheets 1 by means of thin-walled flat tubes 9. A channel 10 in which the photocells 4 are located runs along the central line of each concentrator tunnel 5. The cover consists of concentrator discs 3 which not only concentrate the sun's rays in the manner of a cylindrical Fresnel lens onto focal lines but also refract the resulting light beams downwards. The photocells 4 are located between strand-like secondary lenses 12 and the bottom of the profile channel 10. The platform is centered by the toroidal pipe 6 which rolls along the annular wall 21 on casters 13, and is rotated about the vertical axis d at the angular velocity of the sun, so that during the day the photocells, controlled by known means, always follow the azimuth of the sun. During the night, the platform is rotated back to the starting position. The secondary lens 12 guides the light beam, independently of the level of the particular focal line, to the photocell 4 which covers the underneath of the secondary lens. A light beam 15 striking vertically is shown in the concentrator tunnel 5. The gap between the toroidal pipe 6 and the wall 16 is bridged by a contacting film 17. In addition, a film 18 is clamped between the toroidal pipe 6 and the adjacent energy tunnel so that evaporation of water is prevented. The heat dissipation of the photocells 4, unless already transferred during the hours of sunlight, is passed into the water layer 2 which is separated by a film from the ground 19. The energy stored by the water is emitted 24 hours a day by convection and infrared radiation. The electricity generated by the platform is passed via flexible conductors into an earth cable leading to the center. Rainwater passes through the flat tubes 9 into the water layer 2, from which excess water can flow away.

FIG. 3 shows a perspective view of a lens arrangement which consists of an upper layer 30$a$ having steps 30$e$ and a layer 30$b$ underneath having steps 32$a$ and 32$b$, which enclose channels 31 between them. A Fresnel lens 33 whose steps 34 are at right angles to the steps 32 is located below this stepped lens 30$a$, 30$b$. The layers 30$a$ and 30$b$ have vertical channels 37 into which sheet metal strips 38 are inserted so that the layers cannot move towards one another. The flanks 39$a$ and 39$b$ are preferably mirrored. For regions with sand storms several layers 35 of an extremely thin film are fastened on the outside of the lens arrangement. If the surface of the uppermost layer 36 in each case is scratched, the said layer is removed. It has proved advantageous to bend the edge 30$c$ downwards so that the line 30$d$ is curved, resulting in curved roof elements according to FIG. 2. This applies correspondingly for all flat lens variants.

FIG. 4 shows a cross-section through a lens arrangement 30 with the rays of the sun at 20° and 80° elevation. While the rays 40$a$ emerge as ray 40$b$ after passing four times through boundary faces, said rays making an angle of 18° with the vertical 54, the ray 41$a$ must be reflected at the flank 45$b$. For this reason, the flanks 45$a$ and 45$b$ are mirrored. After passing twice through boundary faces, the ray 42$a$ passes as ray 42$c$ through the channel 46 and emerges as ray 42$b$ at the same angle to the vertical as the ray 40$b$ but with opposite sign. After double refraction, the morning ray 41$a$ with a very obtuse angle of incidence enters the channel 46 as ray and is then reflected to become ray 41$d$. This ray 41$d$ is parallel to the ray 42$c$, so that 41$b$, too, emerges at an angle of +18° to the vertical 54, as in the case of ray 42$b$. All sunrays striking between the limits of the morning incidence of 20° and the midday incidence of 80° lead to emerging beams which lie within the interval 40$b$–41$b$ of the angles of emergence. After triple refraction, the ray 43$a$ strikes the flank 45$b$, undergoes total reflection there and becomes ray 43$e$. It then emerges as ray 43$f$ and is reflected at the mirrored flank region 48$a$ so that it emerges as ray 43$b$ within the allowed angular interval. All 80° rays between the rays 44$a_1$ and 44$a_2$ would emerge outside the allowed angular interval if the flanks 45$a$ and 45$b$ were to merge with one another. To prevent loss of the rays, the channel 46 having the faces 46$a$ and 46$b$ through which rays pass is bordered by a channel 47 which has the faces 47$a$ and 47$b$ through which rays pass and whose walls through which rays pass guide the rays 44$a_1$ and 44$a_2$, optionally in combination with a reflection at the upper mirrored strip 48$a$ of the flank 48$a$, 48$b$, in such a way that they emerge in the allowed interval. The rays between the rays 45$a_3$ and 45$a_4$ undergo total reflection at the flank 48$b$ and then emerge within the allowed angular interval. The ray 44$a_5$ emerges as ray 44$b$ with a negative angle, and the subsequent rays up to 44$a_6$ undergo total reflection at the flank 45$b$ and emerge with a positive angle in the allowed angular range, as does the ray 43$b$. All rays to the right thereof pass through the cylindrical lens with a positive angle, as in the case of the ray 42$a$.

FIG. 5$a$ schematically shows an embodiment of the lens arrangement according to FIGS. 3 and 4, in which the downward-pointing steps 32 are combined with the perpendicular steps 34 of the Fresnel lens underneath to give faceted lenses. The flat upper surface 50 pointing upwards forms the incident surface. In the planes at right angles to the incident sunlight 53, the rectangular regions 51 make the angles $x_1$, $x_2$, $x_3$, ... with the vertical 54, which angles become 90° in the region of the symmetry line 52. However, the rectangular regions 51 pointing towards the photocell are simultaneously inclined at the constant angle y to the vertical 54, in planes containing the sunrays 53. This gives rise to light beams which are simultaneously refracted towards the vertical 54. The planes of the flanks 55$a$, 55$b$, etc. intersect one another close to the focal line, in order to prevent shading of the emerging radiation of the relevant subsequent step. The flanks 56 at right angles to the symmetry line 52 are all in planes which make the constant angle w according to FIG. 4 with the vertical 54.

In FIG. 5$b$, the rays 57$a$ and 57$b$ form the peripheral rays of the light beam produced at the elevation angle u of the sunrays 58. The peripheral rays 59$a$ and 59$b$, which are assigned an elevation angle of 60°, are in a vertical plane.

FIG. 6$a$ shows another embodiment of a lens according to the invention which has steps 60 at right angles to the plane of incidence, so that sunrays 61 having a very obtuse angle of incidence are refracted towards the vertical 54. The rays having a very acute angle of incidence are refracted towards the sun side. The surfaces of the steps 60 are in turn provided with steps 63 of substantially finer division.

FIG. 6$b$ shows the steps in the framed region VI on a larger scale. The steps 64, 65, 66 have prism angles which point towards the symmetry line 67 and become zero at the height of the symmetry line. These steps effect the concentration.

FIG. 7 shows a flat lens viewed from below. Steps 71 whose prism angles assume zero value at the height of the vertex line 70 and increase on both sides with increasing distance from the vertex line 70 run symmetrically to the vertex line 70 along virtually parabolic lines. Each viewing element of the steps 71 which is a distance away from the vertex line 70 has a wedge angle which, in conjunction with the angle which the tangent to the viewing element makes with the vertex line 70, refracts a sunray passing through from the (invisible) upper side optically skew to a focal line.

FIG. 8$a$ shows the cross-section of a cylindrical lens 80 which is in optical contact with the photocell 81. This contact is achieved by introducing a wetting immersion liquid or an optical cement 82 having a tailored refractive index. The geometry meets the requirement that the solar cell 81 should be illuminated with virtually identical luminous intensity for all existing light beams having the peripheral rays 87$a$ and 87$b$. This is achieved by a cylindrical lens whose cross-sectional shape is trapezoidal in the lower part and corresponds to an aspherical plano-convex cylindrical lens in the upper part. In a preferred embodiment, the incident surface 83 has an elliptical sectional curve. The lateral surfaces 84 are likewise in the form of optical functional surfaces, so that total reflection takes place where required. The focal lines 85a, which would be located below the photocell 81, are produced above the photocells 81 owing to the shape of the incident surface, so that the focal line does not migrate through the cell at any solar elevation. The migration of the focal line would assume the magnitude 85b without a secondary lens. By means of the secondary lens, the focal line is positioned in such a way that, when the photocell 81 is suitably coordinated with the incident surface 83, an essentially uniform distribution of the luminous intensity over the cell width is achieved, corresponding to blurred focusing of the focal lines onto the photocells.

Where there is a lateral shift between the subsequent lens and the secondary lens owing to interfering forces when the power station is being operated, the incident surface 83 effects an optical compensation of the shifting of the focal line. While in the case of perpendicular light beams having the peripheral rays 87a the outer rays are caused to converge, the rays of an oblique light beam having the peripheral rays 87b experience divergent refraction.

FIG. 8b shows the refracted rays 88a of the vertically incident light beam having the peripheral rays 87a, the secondary lens 80 being shifted laterally relative to the light beam by a magnitude 89.

Figure 13A:
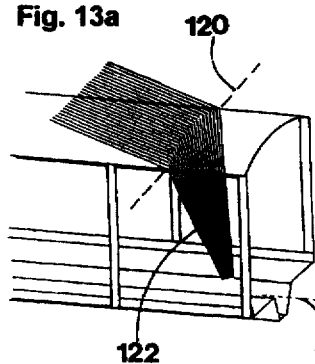
FIGS. 13a, b, c show a comparison of the deflections for different solar heights.
Figure 13B:
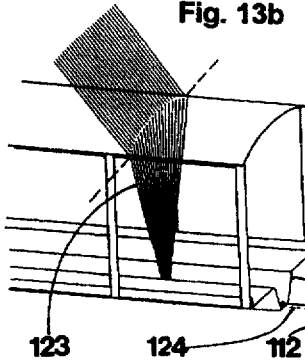
Figure 13C:
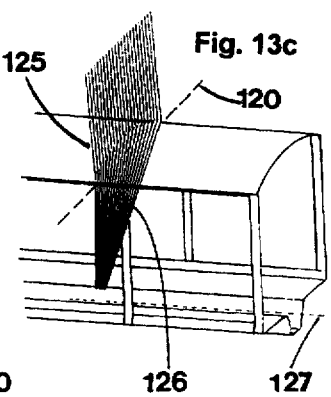

FIG. 8c shows the beam path for the oblique position of the light beams 122 and 126 having the peripheral rays 87c in the case of a lateral shifting by the magnitude 89, said oblique position being shown in FIGS. 13a and 13c.

FIG. 9 shows a further embodiment of a secondary lens which is associated with the photocell 94 and whose effect corresponds to that of the secondary lens of FIG. 8. Considerable material is saved according to the smaller cross-sectional area, and less attenuation is achieved as a result of the shorter light paths for the peripheral rays. The embodiment of the incident surface 83, described in FIG. 8, is divided into the areas 90, 91, 92 and 93. Here too, all lateral surfaces are designed so that total reflection of the rays which may be incident from inside is ensured.

FIG. 10 shows a secondary lens whose outer regions 103a and 103b effect convergent refraction of the outer regions of a light beam which is in a vertical plane, whereas they effect divergent refraction, through the middle region 104, of these rays of a light beam in an oblique plane. The lateral walls 101 are mirrored, with the result that even horizontally shifted rays are reflected to the photocell 102. If the lens region is produced from organic glass, the space 105 underneath, including walls 101, can be produced integrally with the lens region.

FIG. 11 shows a cross-section of a concentrator tunnel 115 having a channel 110 in which a pontoon 111 floats on a body 116 of water and holds the photocell 112. The height of the body 116 of water in the channel determines the distance of the photocell 112 from the flat lens 114.

FIG. 12 shows a secondary lens 116 which is arranged so that it can be displaced laterally relative to the photocell 112a by the magnitude 117a and which effects the shift by a maximum magnitude 117a by means of an apparatus which is not shown, as a function of the lateral shift of the light beam relative to the photocell 112a. As a result, the light beam having the peripheral rays 118a is guided towards the photocell 112a even when these peripheral rays have shifted up to the distance 117 from the symmetry line 117 into the position 118b.

FIG. 13a shows a light beam which is produced by the flat lenses described at the outset. The greatest refraction about axes 120 at right angles to the focal line 121 takes place in the early morning and late afternoon. The refracted light beam 122 makes an angle of about −18° with the vertical. In this oblique position of the light beam, the focal line 121 has the greatest height.

FIG. 13b shows that the light beam 123 is perpendicular twice a day, in each case when the solar elevation is about 60°. The theoretical focal line 124 is then below the photocell 112 which collects the total concentrated radiation. It is even below the channel 110 and thus reaches the lowest level.

As shown in FIG. 13c, the noon sunrays 125 are refracted about the axis 120 at right angles to the focal line towards the sun, so that the light beams 126 lie in planes which make an angle of +18° with the vertical. The focal line 127 once again reaches the same height as the focal line 121 does in the early morning and late afternoon.

We claim:

1. Platform for solar power stations rotatable about a vertical axis (D) having channels (10, 110) floating on a liquid layer (2), and a transparent roof (3) above the channels (10, 110) which refracts sunbeams (122, 123, 126) downwards and concentrates the incident radiation onto photocells (4) arranged below the roof (3), characterized in that the photocells (4) are in heat-conducting connection to the channels (10, 110), and that the channels (10, 110) are formed in such a way that the heat dissipation of the photocells (4) is predominantly passed into the liquid layer (2) through a region of the channels (10, 110) which lies below the surface of the liquid layer (2).

2. Platform according to claim 1, characterized in that the outward-facing layer of the transparent roof (3) forms a horizontal flat lens (30a) having a first outward-facing smooth boundary face (50) which has, on its downward-facing side, a group of second boundary faces which are divided into steps (30e) and, in the operating position, run transversely to the sunrays, the steps (30e) making an angle with the first boundary face (50) such that, optionally in coordination with a second flat lens (36b) having steps (32a and 32b) and optionally with a flat lens (33) having steps (34) perpendicular to the stated steps, a sunray. (40a) having a zenith angle of more than 60° is refracted to give an emerging ray (40b) which makes an angle of less than 30° with the vertical in a direction away from the sun while a sunray (42a) having a zenith angle of less than 20° is refracted to give an emerging ray (42b) which points towards the sun and makes an angle of less than 30° with the vertical (54), and that the rays emerging from the transparent roof (3) are concentrated to a focal line (121, 124, 127) parallel to the sunrays.

3. Platform according to claim 2, characterized in that the rays (40a and 42a) bounding an interval of zenith angles are refracted to give their associated emerging rays (40b and 42b), each of which make with the vertical (54) an angle of virtually the same magnitude but opposite sign.

4. Platform according to claim 2, characterized in that the downward-facing steps (30e) of the outward-facing flat lens (30a), together with upward-facing steps (32a) having the same step division of a flat lens (30b) located underneath, enclose prismatic channels (31).

5. Platform according to claim 4, characterized in that grooves (37), into which thin-walled, tape-like strips (38) which fix the flat lenses (30a and 30h) to one another in the direction of the channels (31) project, run at right angles to the channels (31).

6. Platform according to claim 4, characterized in that the boundary faces (46b, 47b) of each step of the outward-facing flat lens (30a), through which boundary faces rays pass, and the boundary faces (46a, 47a) of each upward-facing step of the flat lens (30b) underneath, through which boundary faces rays pass, enclose two triangular channels (46, 47), the larger (46) of which tapers towards the sun in the operating position and the smaller (47) of which widens towards the sun in the operating position.

7. Platform according to claim 2, characterized in that the boundary faces of the steps 30e and 32a) of the flat lenses (30a and 30b) lying one of top of the other, through which boundary faces rays pass, consist of parallel-strip-like regions (46a and 47a, 46b and 47b) which are present side-by-side and make an obtuse angle with one another.

8. Platform according to claim 2, characterized in that the flanks of the downward-facing steps of the second flat lens (30b) have strip-like regions (48a, 48b) which lie one on top of the other and make obtuse angles with one another.

9. Platform according to claim 2, characterized in that the downward-facing side of the transparent roof consists of facets (51) having edges parallel and at right angles to the perpendicular plane of incidence, those surfaces of the facets (51) through which rays pass being inclined relative to the horizontal so that a vertical section through the facets (51), at right angles to the vertical plane of incidence, is equivalent to a section through a Fresnel lens, and that a section through the facets parallel to the plane of incidence exhibits a periodic step.

10. Platform according to claim 2, characterized in that flank-forming surfaces (45a, 45b, 48a, 48b) of roof-forming flat lenses through which rays entering the interval (40h, 41b) of angles of emergence do not pass in the operating position are mirrored, and that these mirrored surfaces (45a, 45b, 48a, 48b) make an angle with the vertical (154) such that rays (41c) incident on these flanks are reflected in a direction such that they emerge within the interval of angles of emergence which is formed by only refracted sunrays (40a and 42b).

11. Platform according to claim 4, characterized in that a first group of downward-facing steps (60) of the roof-forming flat lens has a coarse division, and that the boundary faces of these steps (60), through which boundary faces rays pass, carry secondary steps (63) which are at right angles to the steps (60) and have a finer division with the varying angles of a Fresnel lens.

12. Platform according to claim 1, characterized in that the transparent roof (3) contains a flat lens with prism-forming steps (71) which run along curved paths symmetrically to a vertex line (70) parallel to the plane of incidence, the prism angles increasing over the length of the steps with increasing distance from the vertex line (70), and furthermore that the prism angles associated with each distance from the vertex line (70) and the angles between the respective tangents to the step (71) and the vertex line (70) are chosen so that all incident sunrays (61) are refracted towards a focal line.

13. Platform according to claim 1, characterized in that a secondary lens (12, 80, 103, 104) whose optical geometry guides light beams, which, as a function of the respective zenith angle, generate focal lines (121, 124, 127) having different distances from the transparent roof (3), within the limits of the predetermined interval of zenith angles, onto the photocells (4, 81, 94) is arranged between the transparent roof (3) and the photocells (4, 81, 94).

14. Structure according to claim 13, characterized in that the photocells (4, 81, 94, 112a) are connected to the secondary lens (12, 80) without any optical distance in between.

15. Platform according to claim 13, characterized in that the geometry of the secondary lens (12, 80, 103, 104) guides the sunrays refracted to give light beams (122, 123, 126), provided that said sunrays are laterally displaced relative to the photocells (81, 94, 102) when they are incident on the secondary lens (12, 80, 103, 104,) in such a way that these light beams (122, 123, 126) are all incident on the photocells (81, 94, 102) within a predetermined interval (89) of the lateral shift.

16. Platform according to claim 13, characterized in that the shape of the entry surface (83, 83a) of the secondary lens 80 is such that the focal lines are within the secondary lens (80) so that they do not move through the photocells (81) at any zenith angle.

17. Platform according to any of claim 13, characterized in that the cross-section of the secondary lens (80) forms a trapezium whose lower side faces the photocells (81, 94, 102) and which has symmetrically divergent sides (84) and an upper side (83) which is formed from three parts and consists of parts (83a), which resemble sections of a longitudinally cut upper half of an ellipse having a horizontal long axis, and a middle part (88b, 90, 104) which effects divergent refraction of obliquely incident rays (87b).

18. Platform according to claim 13, characterized in that the lower side of the secondary lens (80) faces the photocells (81, 94, 102) and that the cross-section of the secondary lens has wall regions which are symmetrical to the vertical and are formed from sides of trapezoids which are present one on top of the other, and that the upper side (90) resembles an arc of a circle.

19. Platform according to claim 13, characterized in that a cylindrical lens (104) whose outer regions (103a, 103b) effect convergent refraction are kept a predetermined distance above the photocells (102) by mirrored wall regions (101).

20. Platform according to claim 1, characterized in that the photocells (112) themselves are supported, in such a way that they float, by a body (116) of liquid, by means of whose level the distance of the photocells (112) from the transparent roof (114) can be adjusted.

21. Platform according to claim 1, characterized in that an element of a module which consists of a photocell (112a) having a central line (119) and a secondary lens (116) or a part of such a secondary lens is arranged displaceably relative to another such element, the distance (117a) between the central line (119) and the symmetry line of the secondary lens (116) being variable, and that, as a function of the shifting of the zone of highest luminous intensity from the photocell (112a), means effect a relative displacement which brings the photocell (112a) and the zone of highest luminous intensity into coincidence again.

22. Platform according to claim 1, characterized in that several layers (35) of an extremely thin removable film are arranged on the transparent roof (3, 30, 50).

* * * * *